United States Patent
Saito

(10) Patent No.: US 10,032,970 B2
(45) Date of Patent: Jul. 24, 2018

(54) SIDE SURFACE TYPE OPTICAL SEMICONDUCTOR DEVICE

(71) Applicant: Rohm Co., Ltd., Kyoto (JP)

(72) Inventor: Koji Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/784,243

(22) Filed: Oct. 16, 2017

(65) Prior Publication Data

US 2018/0114885 A1     Apr. 26, 2018

(30) Foreign Application Priority Data

Oct. 20, 2016   (JP) ................. 2016-205787

(51) Int. Cl.

| H01L 31/0203 | (2014.01) |
|---|---|
| H01L 33/48 | (2010.01) |
| H01L 33/58 | (2010.01) |
| G02B 6/42 | (2006.01) |
| H01L 33/54 | (2010.01) |
| H01L 33/56 | (2010.01) |
| H01L 33/20 | (2010.01) |

(Continued)

(52) U.S. Cl.
CPC ............ *H01L 33/54* (2013.01); *G02B 6/0001* (2013.01); *G02B 6/4201* (2013.01); *G02B 6/4253* (2013.01); *G02B 6/4259* (2013.01); *H01L 31/0203* (2013.01); *H01L 31/02325* (2013.01); *H01L 33/20* (2013.01); *H01L 33/385* (2013.01); *H01L 33/486* (2013.01); *H01L 33/501* (2013.01); *H01L 33/56* (2013.01); *H01L 33/58* (2013.01); *H01L 33/62* (2013.01); *H01L 2933/0058* (2013.01)

(58) Field of Classification Search
CPC ... H01L 33/58; H01L 33/60; H01L 31/02325; G02B 6/4201; G02B 6/4253; G02B 6/4259
See application file for complete search history.

(56) References Cited

U.S. PATENT DOCUMENTS

| 5,606,181 A * | 2/1997 | Sakuma | ................... B41J 2/451 257/79 |
| 6,257,772 B1 * | 7/2001 | Nakanishi | ............ G02B 6/4212 257/432 |

(Continued)

FOREIGN PATENT DOCUMENTS

| JP | 2000-196153 | 7/2000 |
| JP | 2009-224376 | 10/2009 |
| JP | 2016-152260 | 8/2016 |

*Primary Examiner* — Robert Bachner
*Assistant Examiner* — Molly Reida
(74) *Attorney, Agent, or Firm* — Fish & Richardson P.C.

(57) ABSTRACT

A side surface type optical semiconductor device includes a substrate made of an insulating material and having a main surface and a back surface, which face opposite sides to each other in a thickness direction. The substrate includes a first concave portion recessed in the thickness direction and a second concave portion recessed further toward the back surface than the first concave portion, a semiconductor optical element is disposed across the first concave portion and the second concave portion, a hollow portion is formed between the semiconductor optical element and the second concave portion, and the hollow portion is used as a light guide path of the semiconductor optical element.

20 Claims, 6 Drawing Sheets

(51) Int. Cl.
    *H01L 33/62*     (2010.01)
    *H01L 33/38*     (2010.01)
    *H01L 33/50*     (2010.01)
    *F21V 8/00*     (2006.01)
    *H01L 31/0232*     (2014.01)

(56) References Cited

U.S. PATENT DOCUMENTS

| | | | |
|---|---|---|---|
| 6,435,734 B2 * | 8/2002 | Okada | G02B 6/4212 |
| | | | 385/88 |
| 6,944,377 B2 * | 9/2005 | Umebayshi | G02B 6/12002 |
| | | | 385/49 |
| 9,201,200 B2 * | 12/2015 | Bowen | G02B 6/30 |
| 2001/0033722 A1 * | 10/2001 | Okada | G02B 6/4212 |
| | | | 385/94 |
| 2002/0131727 A1 * | 9/2002 | Reedy | G02B 6/4214 |
| | | | 385/88 |
| 2004/0091211 A1 * | 5/2004 | Umebayshi | G02B 6/12002 |
| | | | 385/49 |
| 2005/0180681 A1 * | 8/2005 | Umebayshi | G02B 6/12002 |
| | | | 385/15 |
| 2014/0029894 A1 * | 1/2014 | Bowen | G02B 6/30 |
| | | | 385/37 |

* cited by examiner

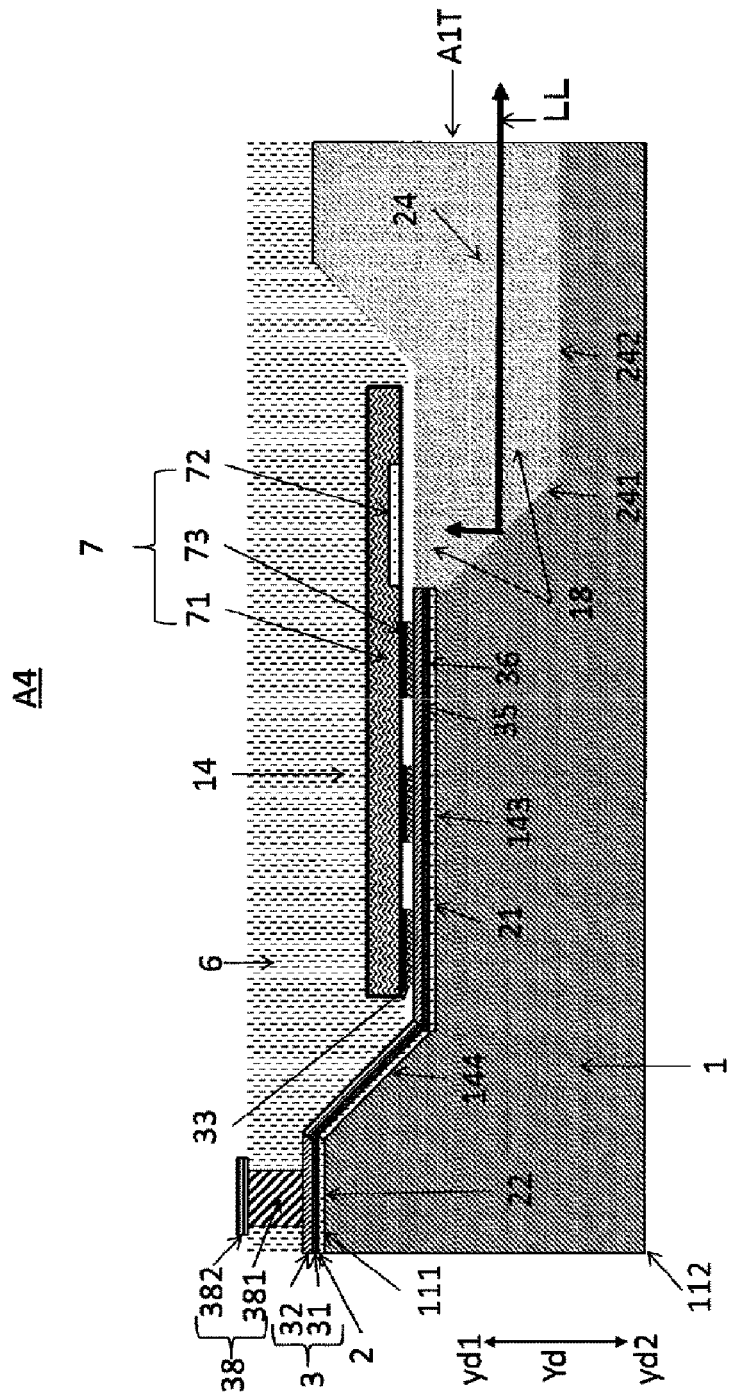

SIDE SURFACE TYPE OPTICAL SEMICONDUCTOR DEVICE

CROSS-REFERENCE TO RELATED APPLICATION

This application is based upon and claims the benefit of priority from Japanese Patent Application No. 2016-205787, filed on Oct. 20, 2016, the entire contents of which are incorporated herein by reference.

TECHNICAL FIELD

The present disclosure relates to a side surface type optical semiconductor device.

BACKGROUND

A side surface type light emitting device and a side surface type light receiving device have been used for mobile phones, PDAs, photo interrupters, lighting devices and the like. In such side surface type optical semiconductor devices, light is emitted or incident substantially in parallel to a substrate on which an optical semiconductor element is mounted, and they are getting widespread popularity in accordance with demands for miniaturization and thinning of various electronic apparatuses.

In the related art, when side type chip electronic components are mounted on and connected to a mother board, an electronic component having a structure in which mounting strength and electrical connection are secured and a self-alignment is operable at the time of soldering, and a method of manufacturing the same have been provided.

Further, in the related art, a side surface type light emitting device capable of efficiently emitting light from an elongated light extracting surface, and a method of manufacturing the same have been provided.

In addition, in the related art, an electronic device capable of more freely setting the overall size has been provided while appropriately protecting an electronic element. In this electronic device, for example, single crystal silicon (Si) is adopted as a substrate on which the electronic element is disposed.

SUMMARY

Some embodiments of the present disclosure provide a side surface type optical semiconductor device capable of being miniaturized and efficiently transmitting and receiving emitted light and incident light.

According to one embodiment of the present disclosure, there is provided a side surface type optical semiconductor device including a substrate made of an insulating material and having a main surface and a back surface, which face opposite sides to each other in a thickness direction. The substrate includes a first concave portion recessed in the thickness direction and a second concave portion recessed further toward the back surface than the first concave portion, a semiconductor optical element is disposed across the first concave portion and the second concave portion, a hollow portion is formed between the semiconductor optical element and the second concave portion, and the hollow portion is used as a light guide path of the semiconductor optical element.

In one embodiment of the present disclosure, the insulating material is a semiconductor material.

In one embodiment of the present disclosure, the semiconductor material is silicon (Si) or silicon carbide (SiC).

In one embodiment of the present disclosure, the first concave portion and the second concave portion are connected via a connecting portion.

In one embodiment of the present disclosure, an inclined portion for guiding light emitted from the semiconductor optical element or entering the semiconductor optical element to the light guide path is formed in the connecting portion.

In one embodiment of the present disclosure, the first concave portion, the second concave portion and the connecting portion are formed by anisotropic or isotropic etching.

In one embodiment of the present disclosure, the hollow portion is covered with transparent resin.

In one embodiment of the present disclosure, the side surface type optical semiconductor further includes a conductive layer making electric conduction with the semiconductor optical element, and an insulating layer interposed between at least a portion of the conductive layer and the substrate.

In one embodiment of the present disclosure, the side surface type optical semiconductor further includes a sealing resin part having a portion filled in the concave portions.

In one embodiment of the present disclosure, the conductive layer has a main surface conductive portion formed on the main surface.

In one embodiment of the present disclosure, the side surface type optical semiconductor device further includes a plurality of terminals, each having a columnar portion which is in contact with the main surface conductive portion and penetrates a sealing resin part.

In one embodiment of the present disclosure, an end surface of the columnar portion is flush with an end surface of the sealing resin part.

In one embodiment of the present disclosure, each of the terminals has a pad portion, which is connected to the columnar portion and exposed from the sealing resin part.

In one embodiment of the present disclosure, the side surface type optical semiconductor device further includes a light shielding layer which is interposed between the substrate and at least a portion of the insulating layer and configured to shield light emitted or received by the semiconductor optical element.

In one embodiment of the present disclosure, the light shielding layer is made of a compound of metal and semiconductor constituting the substrate.

In one embodiment of the present disclosure, the light shielding layer is made of a compound of titanium (Ti) and silicon (Si).

In one embodiment of the present disclosure, the light shielding layer is made of metal.

In one embodiment of the present disclosure, the light shielding layer is made of titanium (Ti).

In one embodiment of the present disclosure, the light shielding layer has a concave inner surface light shielding portion formed in the concave portions.

In one embodiment of the present disclosure, the side surface type optical semiconductor device further includes a back coat layer covering the back surface of the substrate.

BRIEF DESCRIPTION OF DRAWINGS

FIG. 6 is a cross-sectional view illustrating a side surface type optical semiconductor device according to a fourth embodiment of the present disclosure.

DETAILED DESCRIPTION

Figure 1:
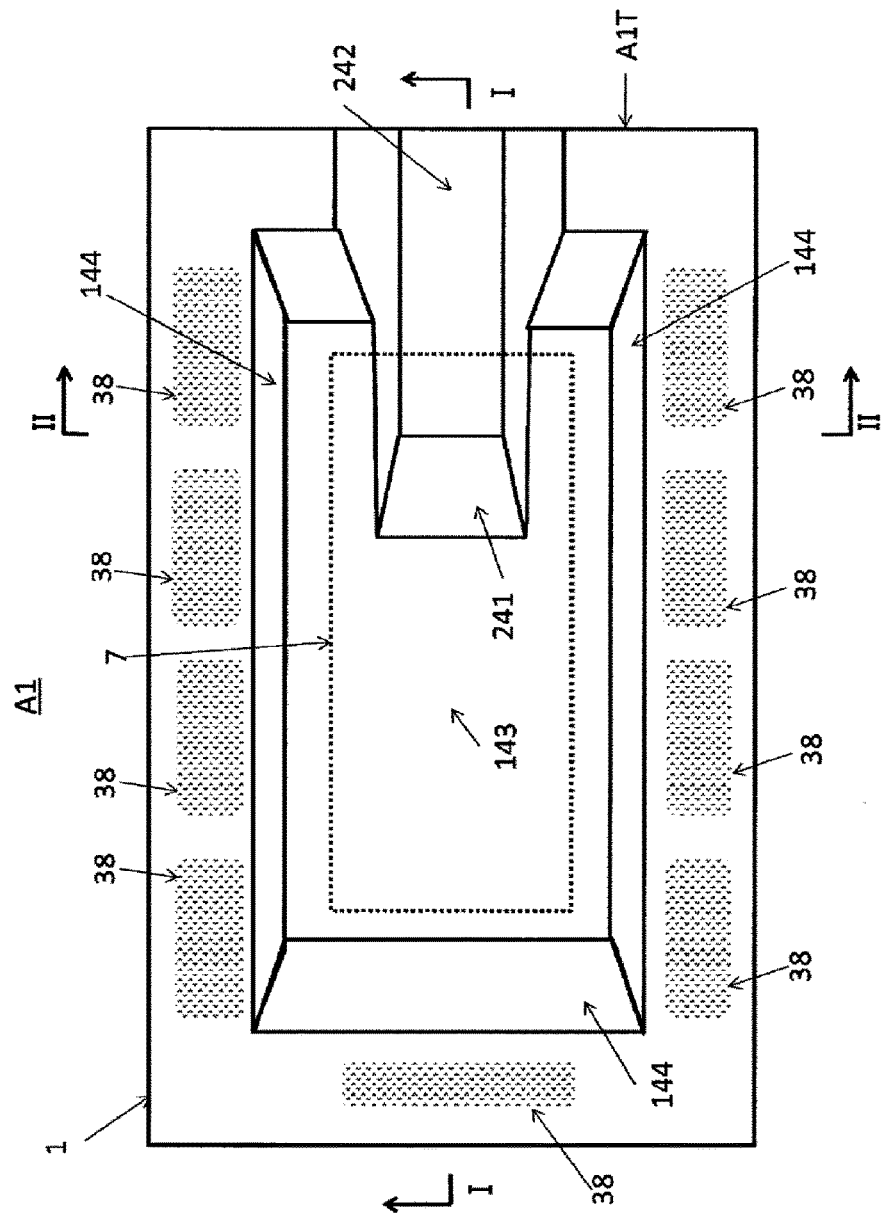
FIG. 1 is a plan view of main parts, which illustrates a side surface type optical semiconductor device according to a first embodiment of the present disclosure.
Figure 2:
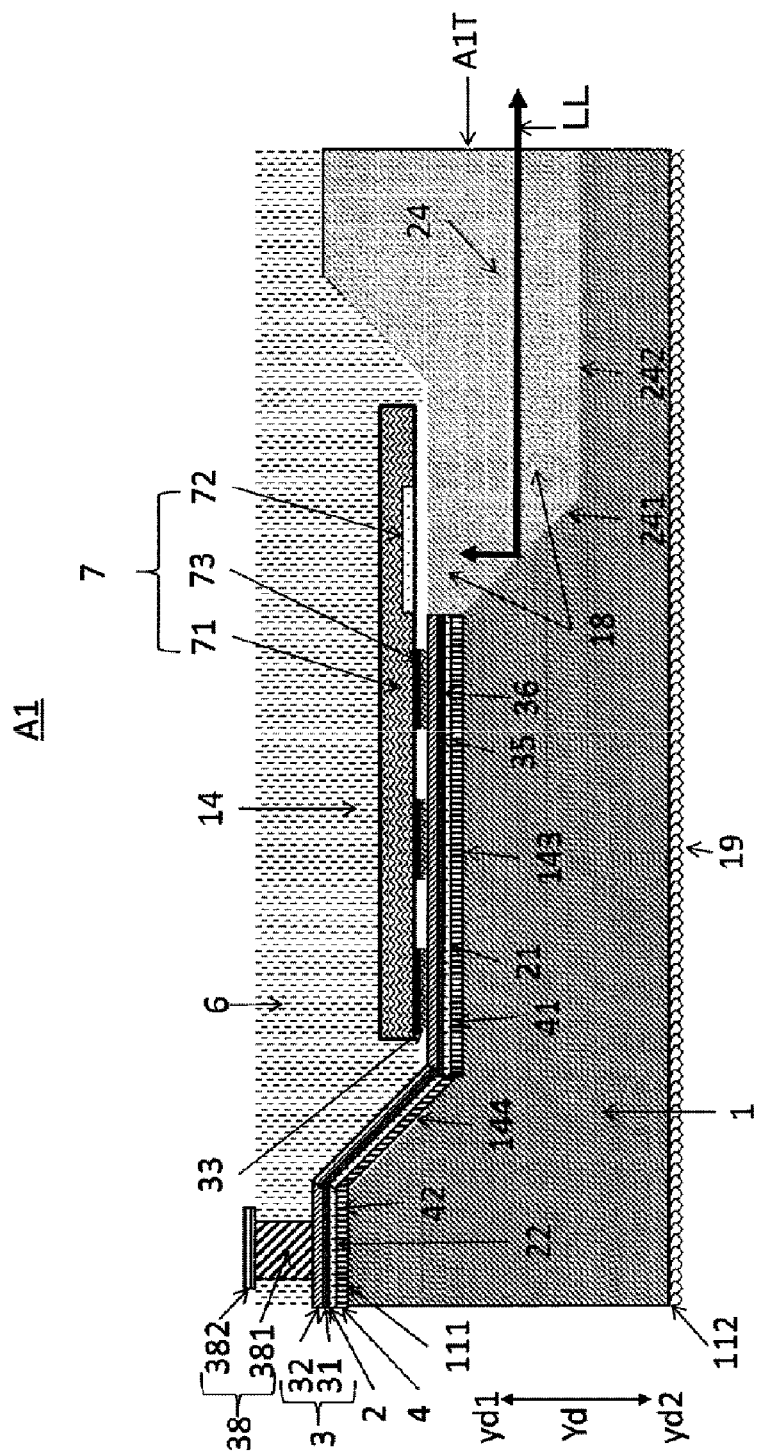
FIG. 2 is a cross-sectional view taken along a line I-I in FIG. 1.
Figure 3:
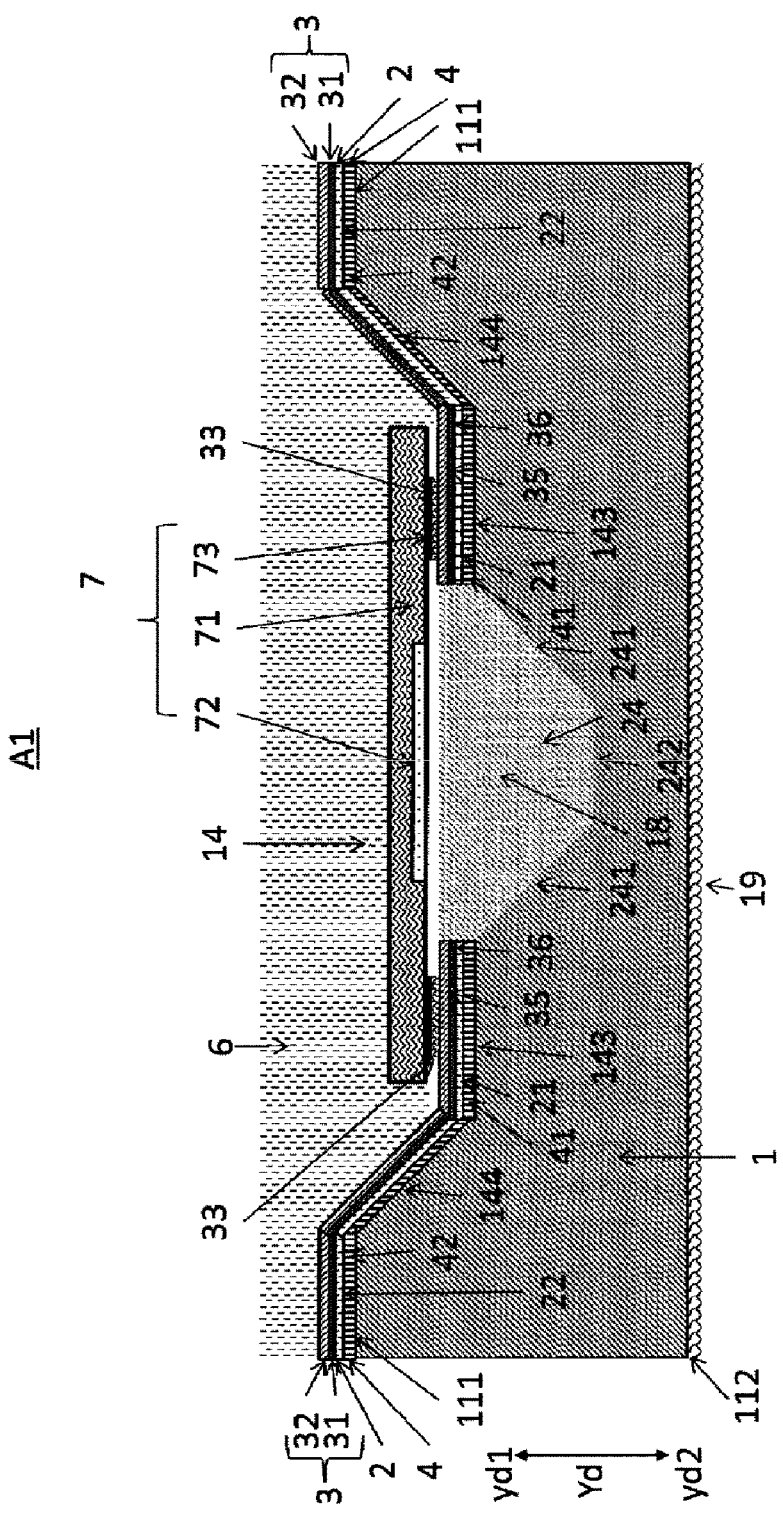
FIG. 3 is a cross-sectional view taken along a line II-II in FIG. 1.

FIG. 1 is a plan view of main parts, which illustrates a side surface type optical semiconductor device A1 according to one embodiment of the present disclosure. FIG. 2 is a cross-sectional view taken along a line I-I in FIG. 1. FIG. 3 is a cross-sectional view taken along a line II-II in FIG. 1. In FIG. 1, a view of a substrate 1 in a thickness direction corresponds to a plan view recited in the present disclosure. Hereinafter, an exemplary embodiment of the present disclosure will be described with reference to FIGS. 1, 2 and 3.

The substrate 1 is made of, for example, a semiconductor material. In the present embodiment, the substrate 1 is made of a silicon (Si) single crystal. The material of the substrate 1 is not limited to silicon (Si), but may be, for example, silicon carbide (SiC). The thickness of the substrate 1 is, for example, 300 to 2,000 μm. For example, a semiconductor light receiving element 7 is disposed on the substrate 1. It is desirable that the substrate 1 used as a mounting substrate is a semiconductor substrate which is made of the same material as a semiconductor substrate on which the semiconductor light receiving element 7 is mounted. This is because the same semiconductor equipment and semiconductor manufacturing process can be used and it is also advantageous in terms of thermal stress and mechanical stress since the thermal expansion coefficients of the mounting substrate as a base and the substrate to be mounted, i.e., the semiconductor substrate on which the semiconductor light receiving element 7 is formed are the same as each other. Of course, the substrate 1 may be an insulating material such as a film-like wiring board made of polyimide, a flexible wiring board or the like.

As illustrated in FIG. 2, the substrate 1 has a main surface 111 and a back surface 112.

The main surface 111 is arranged in one direction yd1 of the thickness direction Yd. The main surface 111 is flat. The main surface 111 is orthogonal to the thickness direction Yd. The crystal orientation of the main surface 111 is a (100) plane or a (110) plane. In the present embodiment, the (100) plane is used as the main surface 111.

The back surface 112 is arranged in the other direction yd2 of the thickness direction Yd. That is, the back surface 112 and the main surface 111 are formed on opposite sides in the thickness direction Yd. The back surface 112 is flat. The back surface 112 is orthogonal to the thickness direction Yd.

A first concave portion 14 and a second concave portion 24 are formed on the substrate 1. Each of these concave portions is formed by anisotropic etching or isotropic etching which is well known in the art.

The first concave portion 14 is recessed from the main surface 111. The semiconductor light receiving element 7 is arranged to extend from the first concave portion 14 to the second concave portion 24. The depth of the first concave portion 14 is, for example, 100 to 1,800 μm. The first concave portion 14 has a rectangular shape when viewed in the thickness direction. The shape of the first concave portion 14 is substantially determined depending on the crystal orientation of the main surface 111 and an etching method.

One end of the second concave portion 24 is connected to the first concave portion 14 and the other end thereof extends to an end portion A1T of the side surface type optical semiconductor device A1. Thus, a light guide path 18 connected to the first concave portion 14 is formed in the side portion of the side surface type optical semiconductor device A1. Light LL entering from the end portion A1T is transmitted to a light receiving part 72 of the semiconductor light receiving element 7 via the light guide path 18. When a semiconductor light emitting element is installed in place of the semiconductor light receiving element 7, the light LL is transmitted to another light receiving part (not shown) via the light guide path 18 and the end portion A1T.

A bottom surface 242 of the second concave portion 24 faces the same side as the main surface 111 in the thickness direction Yd of the substrate 1. The bottom surface 242 of the second concave portion 24 has a rectangular shape when viewed in the thickness direction. The bottom surface 242 of the second concave portion 24 is a surface orthogonal to the thickness direction.

A first side surface (connecting portion) 241 of the second concave portion 24 rises from the bottom surface 242. The first side surface (connecting portion) 241 of the second concave portion 24 is connected to the bottom surface 242 of the second concave portion 24. The first side surface (connecting portion) 241 of the second concave portion 24 is inclined with respect to the thickness direction. The angle of the first side surface (connecting portion) 241 of the second concave portion 24 with respect to a plane orthogonal to the thickness direction is approximately 55 degrees. This is derived from adopting the (100) plane as the main surface 111. The first side surface (connecting portion) 241 of the second concave portion 24 has three flat surfaces. The first side surface (connecting portion) 241 of the second concave portion 24 serves as a connecting portion connecting the first concave portion 14 and the second concave portion 24.

A bottom surface 143 of the first concave portion 14 has a rectangular shape as a whole and is flat when viewed in the thickness direction. The bottom surface 143 faces the same side as the main surface 111 in the thickness direction Yd and is connected to the first side surface (connecting portion) 241 of the second concave portion 24.

A second side surface 144 of the first concave portion 14 exists on the side opposite to the first side surface 241 of the second concave portion 24, which is the connecting portion of both concave portions, and rises from the bottom surface 143 of the first concave portion 14. The second side surface 144 of the first concave portion 14 is connected to the main surface 111. The second side surface 144 of the first concave portion 14 is inclined with respect to the thickness direction Yd. The angle of the second side surface 144 of the first concave portion 14 with respect to a plane orthogonal to the thickness direction Yd is approximately 55 degrees. This is derived from adopting the (100) plane as the crystal of the main surface 111.

An untreated or back coat layer 19 is formed on the back surface 112. The back coat layer 19 covers the entire back surface 112. The back coat layer 19 is made of, for example, silicon nitride (SiN).

A light shielding layer 4 is interposed between the main surface 111 of the substrate 1 and at least a portion of an insulating layer 2 and shields light received by the semiconductor light receiving element 7. The light shielding layer 4 is formed directly on the substrate 1. The light shielding layer 4 is made of a compound of metal and semiconductor constituting the substrate 1, more specifically, a compound of titanium (Ti) and silicon (Si). Further, the light shielding layer 4 may be a layer made of metal such as titanium (Ti). However, the light shielding layer 4 may not be provided.

The light shielding layer 4 has a concave portion inner surface light shielding portion 41 and a main surface light shielding portion 42. The concave portion inner surface light shielding portion 41 is a portion of the light shielding layer 4 which is formed in the first concave portion 14 of the substrate 1. The main surface light shielding portion 42 is a portion of the light shielding layer 4 which is formed on the main surface 111.

The insulating layer 2 is interposed between a conductive layer 3 and the substrate 1. The thickness of the insulating layer 2 is, for example, about 0.1 μm to 1.0 μm. The insulating layer 2 is made of, for example, silicon dioxide ($SiO_2$) or silicon nitride (SiN).

The insulating layer 2 has a concave portion inner surface insulating portion 21 and a main surface insulating portion 22.

The concave portion inner surface insulating portion 21 is formed in the first concave portion 14 of the substrate 1. In the present embodiment, it is formed on both of the bottom surface 143 of the first concave portion 14 and the second side surface 144 of the first concave portion 14. The concave portion inner surface insulating portion 21 is formed by, for example, CVD or sputtering. The concave portion inner surface insulating portion 21 is made of, for example, silicon dioxide ($SiO_2$).

The main surface insulating portion 22 is formed on the main surface 111 of the substrate 1. The main surface insulating portion 22 is formed by, for example, CVD or sputtering. The main surface insulating portion 22 is made of, for example, silicon dioxide ($SiO_2$). In the present embodiment, the main surface insulating portion 22 covers the entire main surface 111.

The conductive layer 3 makes electric conduction with the semiconductor light receiving element 7. The conductive layer 3 is used to form a current path for inputting/outputting a current to/from the semiconductor light receiving element 7.

The conductive layer 3 includes a seed layer 31 and a plating layer 32.

The seed layer 31 is a so-called underlying layer for forming a desired plating layer 32. The seed layer 31 is interposed between the insulating layer 2 and the plating layer 32. The seed layer 31 is made of, for example, copper (Cu). The seed layer 31 is formed by, for example, sputtering. The thickness of the seed layer 31 is, for example, 1 μm or less.

The plating layer 32 is formed by electrolytic plating using the seed layer 31. The plating layer 32 is formed of a layer in which, for example, copper (Cu), titanium (Ti), nickel (Ni) and the like are laminated. The thickness of the plating layer 32 is, for example, about 3 μm to 10 μm, which is greater than the thickness of the seed layer 31.

The conductive layer 3 has a concave portion inner surface conductive portion 35 and a main surface conductive portion 36.

The concave portion inner surface conductive portion 35 is a portion formed in the first concave portion 14 (the concave portion inner surface insulating portion 21 of the insulating layer 2) and is formed at an appropriate position of the bottom surface 143 of the first concave portion 14 and the second side surface 144 of the first concave portion 14. The main surface conductive portion 36 includes a portion functioning as a pad for mounting the semiconductor light receiving element 7, a portion functioning as a wiring, and the like.

The main surface conductive portion 36 is a portion formed on the main surface 111 (the main surface insulating portion 22 of the insulating layer 2).

The semiconductor light receiving element 7 is mounted in the first concave portion 14. The semiconductor light receiving element 7 of the present embodiment has a main body 71, a light receiving part 72 and an electrode 73 and is configured with a phototransistor and a photodiode of a so-called flip chip type, which is implemented without using a wire or the like. The main body 71 performs the control of light reception. Examples of such control may be performed on a passive element such as a chip resistor, an inductor, a capacitor or the like for passively controlling a current input/output to/from the semiconductor light receiving element 7, except for an integrated circuit element such as an application specific integrated circuit (ASIC).

The main body 71 is a member serving as the base of the semiconductor light receiving element 7. The light receiving part 72 is a portion that receives light to be converted into electric charges by a photoelectric conversion function. The first side surface 241 of the second concave portion 24 is arranged in the front of the light receiving part 72. The electrode 73 is an electrode making electric conduction with the light receiving part 72. The electrode 73 is made of, for example, gold (Au), aluminum (Al) or the like. The electrode 73 is bonded to an appropriate place of the concave portion inner surface conductive portion 35 of the conductive layer 3 via a bonding layer 33. The bonding layer 33 is made of, for example, an alloy containing tin (Sn). Specifically, the alloy is a lead-free solder such as a tin (Sn)-antimony (Sb)-based alloy or a tin (Sn)-silver (Ag)-based alloy.

A sealing resin part 6 seals at least a portion of the first concave portion 14 and the second concave portion 24.

The sealing resin part 6 has a portion covering the main surface 111. Examples of the material of the sealing resin part 6 may include epoxy resin, phenol resin, polyimide resin, polybenzoxazole (PBO) resin and silicone resin. The material of the sealing resin part 6 may also be transparent resin.

Further, the optical semiconductor device A1 includes a plurality of terminals 38. The plurality of terminals 38 is used to mount the optical semiconductor device A1 on a circuit board or the like. Each of the terminals 38 has a columnar portion 381 and a pad portion 382.

The columnar portion 381 is in contact with the conductive layer 3 and penetrates the sealing resin part 6 in the thickness direction. The columnar portion 381 is made of, for example, copper (Cu). The upper end face of the columnar portion 381 in the figure is flush with the end face of the sealing resin part 6.

The pad portion 382 is connected to the columnar portion 381 by covering the end surface of the columnar portion 381 and is exposed from the sealing resin part 6. The pad portion 382 is composed of, for example, a nickel (Ni) layer, a lead (Pb) layer and a gold (Au) layer, which are laminated to each other.

Next, the operation of the optical semiconductor device A1 will be described.

According to the present embodiment, the semiconductor light receiving element 7 is disposed in the first concave portion 14 and the second concave portion 24 of the substrate 1. Therefore, it is possible to miniaturize the entire optical semiconductor device A1 while appropriately protecting the semiconductor light receiving element 7. In addition, by forming the light guide path 18 on the substrate 1 on which the semiconductor light receiving element 7 is disposed, it is possible to ensure that light to be detected among light from the outside reaches the semiconductor light receiving element 7. Therefore, it is possible to improve the detection accuracy of the optical semiconductor device A1.

The light guide path 18 is a cavity or is filled with transparent resin so that it is more likely to transmit light. Therefore, it is suitable for improving the detection accuracy of the optical semiconductor device A1.

The light shielding layer 4 covers the first concave portion 14, the main surface 111 and the second concave portion 24, thereby making it possible to prevent unintended light from the outside from reaching the semiconductor light receiving element 7. This is advantageous for improving the detection accuracy of the optical semiconductor device A1. However, the light shielding layer 4 may not be provided.

The light shielding layer 4, which is made of a compound of Ti and Si, is suitable for blocking light including infrared light. This is desirable to improve the detection accuracy of the optical semiconductor device A1.

Figure 4:
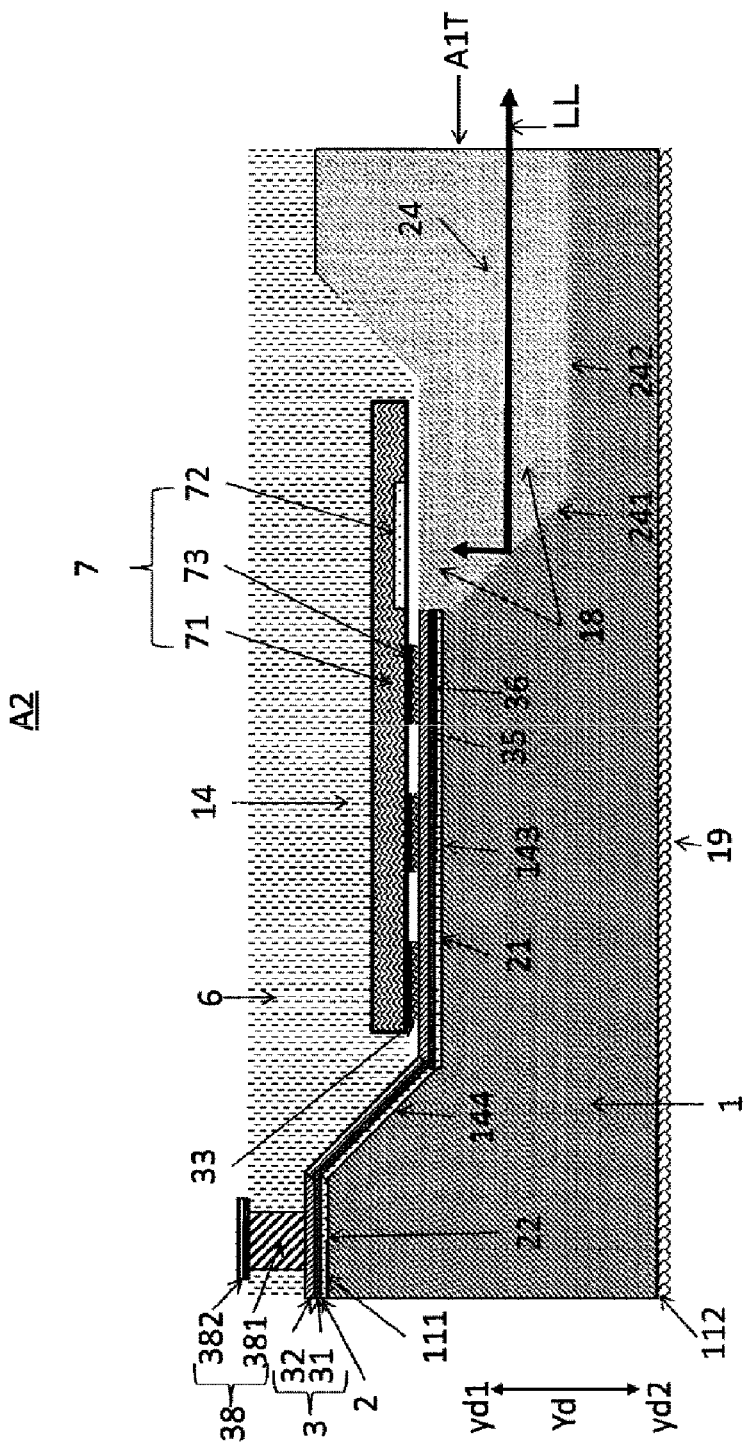
FIG. 4 is a cross-sectional view illustrating a side surface type optical semiconductor device according to a second embodiment of the present disclosure.

FIG. 4 illustrates a side surface type optical semiconductor device A2 according to a second embodiment of the present disclosure. The side surface type optical semiconductor device A2 illustrated in FIG. 4 does not include the light shielding layer 4 and the other configuration is the same as the side surface type optical semiconductor device A1 illustrated in FIG. 2.

In the present embodiment, if external unintended light is not considered, the light shielding layer 4 may be omitted, thereby making it possible to manufacture the side surface type optical semiconductor device A2 at a lower cost.

Figure 5:
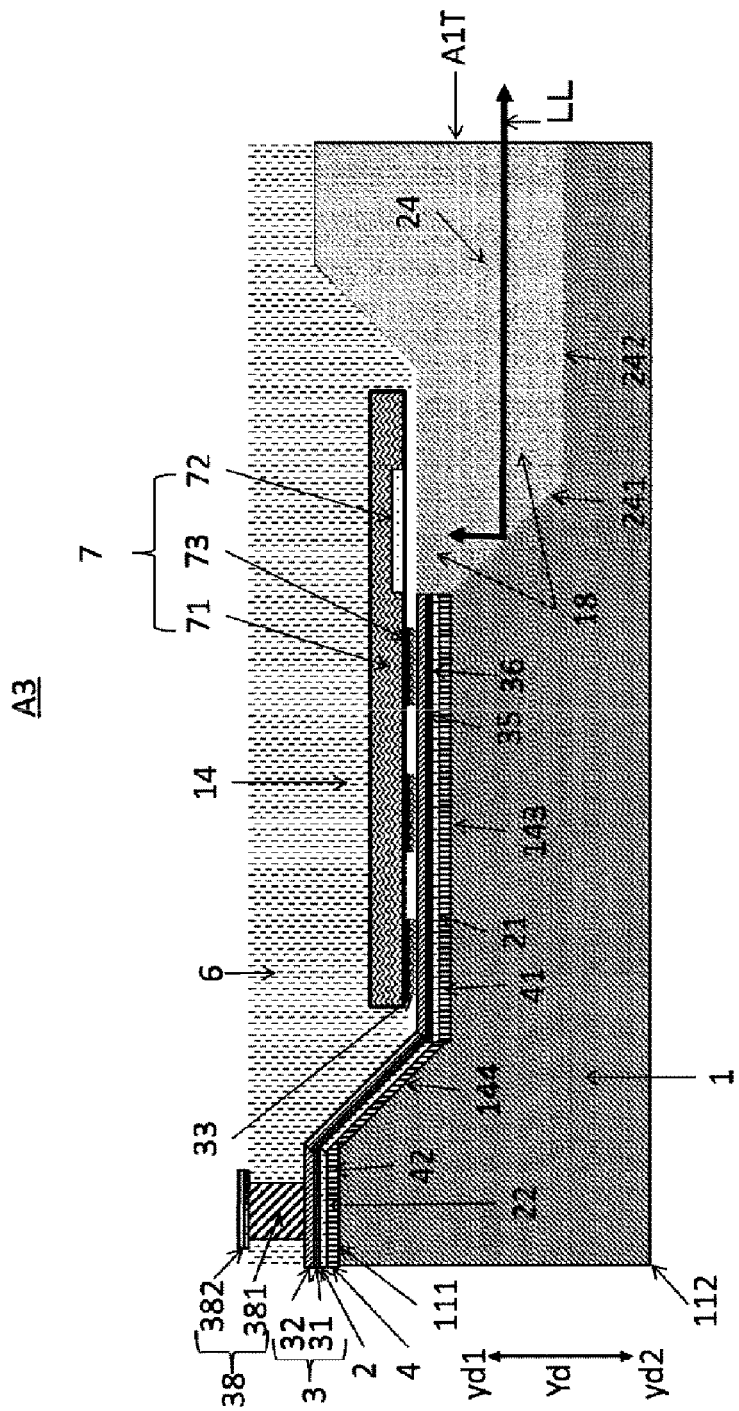
FIG. 5 is a cross-sectional view illustrating a side surface type optical semiconductor device according to a third embodiment of the present disclosure.

FIG. 5 illustrates a side surface type optical semiconductor device A3 according to a third embodiment of the present disclosure. The side surface type optical semiconductor device A3 illustrated in FIG. 5 does not include the back coat layer 19 and the other configuration is the same as the side surface type optical semiconductor device A1 illustrated in FIG. 2.

In the present embodiment, if the durability of the back surface is not considered, the back coat layer 19 may be omitted, thereby making it possible to manufacture the side surface type optical semiconductor device A3 at a lower cost.

FIG. 6 illustrates a side surface type optical semiconductor device A4 according to a fourth embodiment of the present disclosure. The side surface type optical semiconductor device A4 illustrated in FIG. 6 does not disclose the light shielding layer 4 and the back coat layer 19, and the other configuration is the same as the side surface type optical semiconductor device A1 illustrated in FIG. 2.

In the present embodiment, if the external unintended light and the durability of the back surface are not considered, the light shielding layer 4 and the back coat layer 19 may be omitted, thereby making it possible to manufacture the side surface type optical semiconductor device A4 at a lower cost.

Although the present disclosure has been described with a light receiving element, it is needless to say that the same can be done even when the light receiving element is replaced with a light emitting element.

INDUSTRIAL APPLICABILITY

The present disclosure can be applied to side surface type optical semiconductor devices which are needed for miniaturization and improvement of the detection accuracy. Therefore, the present disclosure has high industrial applicability.

According to the present disclosure in some embodiments, the above-described semiconductor optical element is embedded in the above-described concave portion of the above-described substrate. Therefore, it is possible to miniaturize the total size of the above-described side surface type optical semiconductor device while adequately protecting the semiconductor optical element. In addition, by forming a light guiding portion on the substrate in which the semiconductor optical element is embedded, it is possible to ensure that the light to be detected among light from the outside reaches the semiconductor optical element. Therefore, it is possible to improve the detection accuracy of the above-described side surface type optical semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A side surface type optical semiconductor device comprising:
   a substrate made of an insulating material and having a main surface and a back surface, which face opposite sides to each other in a thickness direction,
   wherein the substrate includes a first concave portion recessed in the thickness direction and a second concave portion recessed further toward the back surface than the first concave portion, a semiconductor optical element is disposed across the first concave portion and the second concave portion, a hollow portion is formed between the semiconductor optical element and the second concave portion, and the hollow portion is used as a light guide path of the semiconductor optical element.

2. The side surface type optical semiconductor device of claim 1, wherein the insulating material is a semiconductor material.

3. The side surface type optical semiconductor device of claim 2, wherein the semiconductor material is silicon (Si) or silicon carbide (SiC).

4. The side surface type optical semiconductor device of claim 1, wherein the first concave portion and the second concave portion are connected via a connecting portion.

5. The side surface type optical semiconductor device of claim 4, wherein an inclined portion for guiding light emitted from the semiconductor optical element or entering the semiconductor optical element to the light guide path is formed in the connecting portion.

6. The side surface type optical semiconductor device of claim 5, wherein the first concave portion, the second concave portion and the connecting portion are formed by anisotropic or isotropic etching.

7. The side surface type optical semiconductor device of claim 1, wherein the hollow portion is covered with transparent resin.

8. The side surface type optical semiconductor device of claim 1, further comprising:
 a conductive layer making electric conduction with the semiconductor optical element; and
 an insulating layer interposed between at least a portion of the conductive layer and the substrate.

9. The side surface type optical semiconductor device of claim 8, further comprising a sealing resin part having a portion filled in the concave portion.

10. The side surface type optical semiconductor device of claim 9, wherein the conductive layer has a main surface conductive portion formed on the main surface.

11. The side surface type optical semiconductor device of claim 10, further comprising a plurality of terminals, each having a columnar portion which is in contact with the main surface conductive portion and penetrates the sealing resin part.

12. The side surface type optical semiconductor device of claim 11, wherein an end surface of the columnar portion is flush with an end surface of the sealing resin part.

13. The side surface type optical semiconductor device of claim 11, wherein each of the terminals has a pad portion, which is connected to the columnar portion and exposed from the sealing resin part.

14. The side surface type optical semiconductor device of claim 13, further comprising a light shielding layer which is interposed between the substrate and at least a portion of the insulating layer and configured to shield light emitted or received by the semiconductor optical element.

15. The side surface type optical semiconductor device of claim 14, wherein the light shielding layer is made of a compound of metal and semiconductor constituting the substrate.

16. The side surface type optical semiconductor device of claim 15, wherein the light shielding layer is made of a compound of titanium (Ti) and silicon (Si).

17. The side surface type optical semiconductor device of claim 14, wherein the light shielding layer is made of metal.

18. The side surface type optical semiconductor device of claim 17, wherein the light shielding layer is made of titanium (Ti).

19. The side surface type optical semiconductor device claim 14, wherein the light shielding layer has a concave inner surface light shielding portion formed in the concave portion.

20. The side surface type optical semiconductor device of claim 13, further comprising a back coat layer covering the back surface of the substrate.

* * * * *